(12) United States Patent
Venes et al.

(10) Patent No.: US 6,346,902 B1
(45) Date of Patent: Feb. 12, 2002

(54) ANALOG TO DIGITAL CONVERTER

(75) Inventors: Arnoldus Gerardus Wilhelmus Venes, Aliso Viejo, CA (US); Rudy Johan Van De Plassche, Waaire (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/635,550

(22) Filed: Aug. 10, 2000

(30) Foreign Application Priority Data

Aug. 13, 1999 (EP) .............................. 99202636

(51) Int. Cl.$^7$ ................................ H03M 1/46
(52) U.S. Cl. ...................... 341/154; 341/127; 341/155; 341/158; 341/159
(58) Field of Search ................ 341/127, 154, 341/155, 158, 159

(56) References Cited

U.S. PATENT DOCUMENTS 5,119,094 A * 6/1992 Brokaw ...................... 341/154
5,528,242 A * 6/1996 Kumar ....................... 341/159
5,877,718 A * 3/1999 Andoh et al. ................ 341/155
6,002,356 A * 12/1999 Cooper ....................... 341/160

OTHER PUBLICATIONS

"A 10–b, 100–MS/s CMOS A/D Converter", by Kwang Young Kim et al, IEEE Journal of Solid–State Circuits, vol. 32, No. 3, Mar. 1997.

* cited by examiner

Primary Examiner—Michael Tokar
Assistant Examiner—Lam T. Mai

(57) ABSTRACT

An analog to digital converter has a differential input arrangement with a static reference ladder and comparators for comparing the differential input signal with respective reference voltages from the ladder. For sensing the positive and the negative values of the input signal the same taps of the reference ladder are used.

4 Claims, 2 Drawing Sheets

ANALOG TO DIGITAL CONVERTER

BACKGROUND OF THE INVENTION

This invention relates to an analog to digital converter comprising a resistive reference ladder with a plurality of pairs of taps for generating a plurality of pairs of reference voltages and means for sensing a differential input signal at each of said plurality of pairs of reference voltages. An analog to digital converter of this kind is known from an article "A 10-b, 100 MS/s CMOS A/D Converter" of K. Y. Kim et al in IEEE Journal of Solid State Circuits, Vol. 32, No. 3, March 1997.

In present day integration technics with its very small dimensions and low voltages, it is difficult to make an a/d converter with a sufficiently clean (distortion free) ground potential for the reference voltage and for the input voltage. Therefore it has become common practice to use a differential input arrangement for the signal voltage and the reference voltage, so that any common mode distortions are balanced out. Another advantage of a differential input arrangement is that the voltage span of the input signal can be nearly twice the voltage span in case a single ended input arrangement is used.

A prior art implementation of a differential input a/d converter, which is e.g. applied in applicant's integrated circuit TDA 8085, has two so called dynamic reference ladders, which generate the differential reference voltages and which simultaneously carry the partial voltages of the differential input signal. This a/d converter has relatively few comparators, because it directly compares the sum of one partial input voltage and one reference voltage with the sum of the other partial input voltage and the other reference voltage. Another advantage is that common mode voltages are automatically cancelled out. However, the reference ladders, together with the input capacitances of the comparators, act as a low pass filter for the input signal, so that this type of a/d converter is not suitable for converting wideband signals. Moreover, the summing up of the reference voltage and input voltage substantially reduces the maximum voltage span of the input voltage.

In contradistinction, the a/d converter described in the above referenced article, uses a static reference ladder, which need more comparators but which has better high frequency performance than the one with dynamic ladders. However the number of taps on the reference ladder still presents a problem to be encountered. In a full flash a/d converter with a single ended input and generating e.g. an 8-bit encoded digital representation of the analog input signal, the signal is quantized into 256 levels requiring a reference ladder with 255 taps. The differential implementation of the quantizer further increases the number of reference taps by a factor 2. There are already proposed methods to substantially reduce the number of reference taps and the number of comparators. A well known technic is to use a flash quantizer only for the most significant bits, and generating folding signals and quantizing these folding signals for obtaining the less significant bits. The number of comparators and the number of taps may further be reduced by generating only a few folding signals and obtaining the other folding signals by linear interpolation. With these technics an 8-bit differential quantizer may in practice require a reference ladder of not more than 38 taps.

SUMMARY OF THE INVENTION

The present invention seeks to provide a further reduction of the number of reference taps in a differential quantizer with a static reference ladder and the analog to digital converter of the present invention is therefore characterized in that each of said plurality of pairs of taps of the reference ladder, which is used to sense a certain level of the differential input signal, is also used to sense the differential input signal at the level which is reversed in polarity with respect to said certain level. The invention allows in an a/d converter the use of a differential input arrangement with no more (e.g. 19) reference taps than are normally required in an a/d converter with a single ended input arrangement.

Apart from the reduction in reference taps, the a/d converter of the present invention has the advantage that, for the same magnitude of the differential input signal to be sensed, the total voltage across the reference ladder is half the voltage across the reference ladder of the above referenced article of K. Y. Kim et al. Therefore, the a/d converter of the present invention can be implemented in an integrated circuit chip which need only half the supply voltage of the integrated circuit in which the prior art converter is implemented. Furthermore, in prior art a/d converters there is undesired crosstalk from the input signal to the reference ladder through the input capacitances of the sensing means. In contradistinction, in the a/d converter of the present invention, the crosstalk caused by the two polarity reversed input signals through the input capacitances of the respective sensing means connected to the same tap, cancel against each other, so hat the reference voltages at the taps of the ladder remain substantially free of input signal residues.

It is a further object of the present invention to provide an analog to digital converter which is characterized in that each of said means for sensing the differential input signal comprises a pair of transconductance amplifiers, which receives the differential input signal and a pair of reference voltages, and means to combine the output currents of the transconductance amplifiers. By this measure a simple and efficient way to combine the outputs of the amplifiers into a single differential output current is obtained.

In a differential a/d converter using a static reference ladder it is of importance that the common mode voltage of the reference ladder equals the common mode voltage of the differential input voltage. In the above mentioned prior art publication the differential input voltage and the differential reference ladder are both assumed to be balanced at zero ground level. In integrated circuit technic this will usually not be the case and to cope with this problem the analog to digital converter of the present invention may further be characterised by means to equalize the common mode voltage of the differential input signal and the midtap voltage of the reference ladder with each other.

BRIEF DESCRIPTION OF THE DRAWING

These and other aspects of the invention will be described with reference to the attached figures. Herein shows.

DESCRIPTION OF THE PREFERRED EMBODIMENTS

Figure 1:
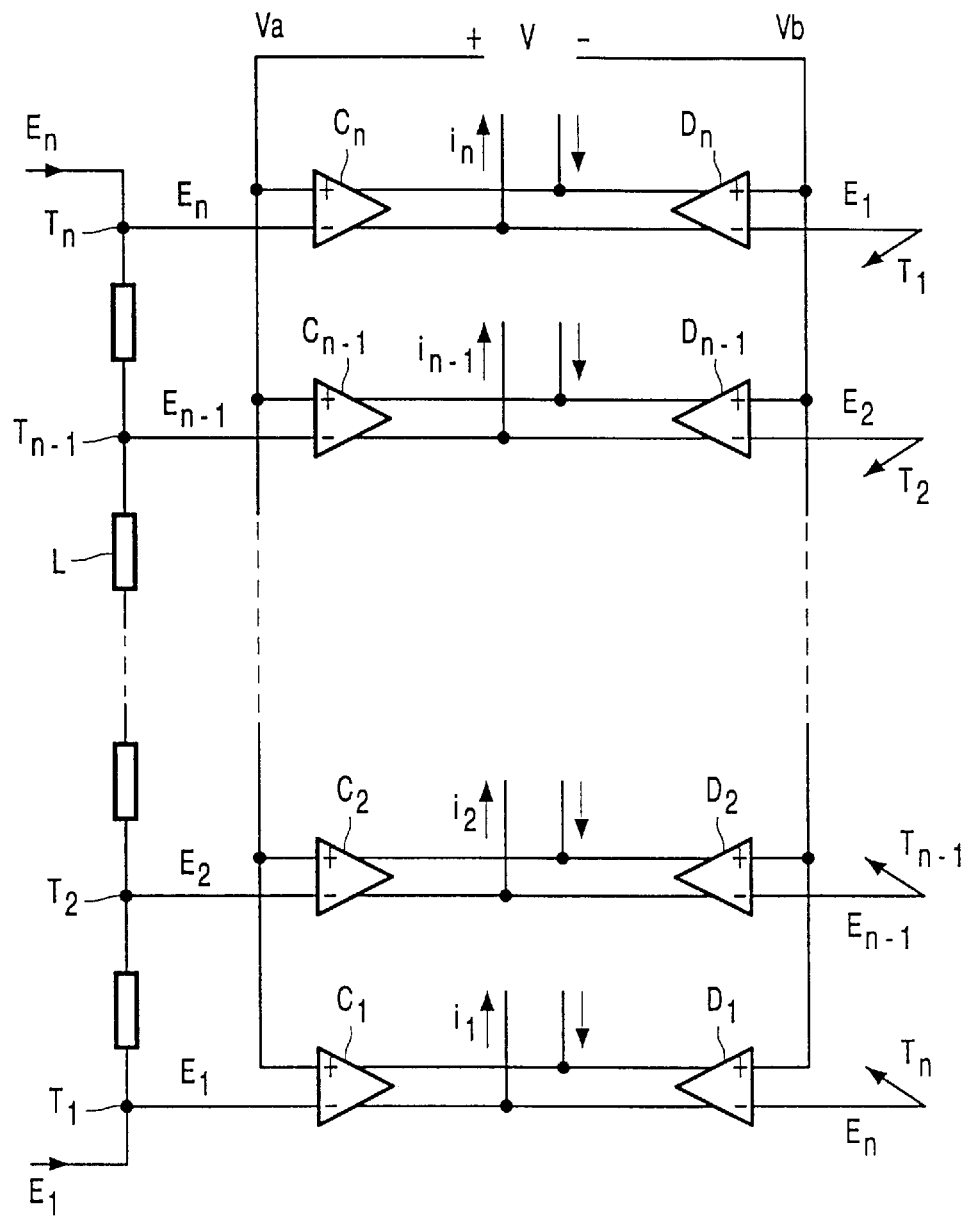
FIG. 1 an embodiment of an analog to digital converter according to the invention and FIG. 2 an arrangement for equalizing the common mode component of the input signal and the midtap voltage of the reference ladder in an a/d converter according to the invention.

FIG. 1 shows a resistive reference ladder L comprising a plurality of N-1 series-connected resistors and N taps $T_1 \ldots T_n$ from which respective reference voltages $E_1 \ldots E_n$ may be obtained. The arrangement of FIG. 1 further comprises N pairs of differential amplifiers $C_1$-$D_1$, $C_2$-$D_2$, ... $C_n$-$D_n$, each pair comprising a first differential amplifier $C_1$ ... $C_n$ and a second differential amplifier $D_1$ ... $D_n$.

A differential input signal v is composed of two partial (single ended) input voltages $V_a$ and $V_b$, for which holds that $v=v_a-v_b$. If the common mode component of $v_a$ and $v_b$ is defined as $v_{cm}=(v_a+v_b)/2$, it follows that $v_a=v/2+v_{cm}$ and $v_b=-v/2+v_{cm}$. Each of the first differential amplifiers $C_1$ ... $C_n$ has a (+) input terminal connected to the partial input voltage $v_a$, a (−) input terminal connected to the respective tap $T_1$ ... $T_n$ of the reference ladder and two output terminals. Furthermore, each of the second differential amplifiers $D_1$ ... $D_n$ has a (+) input terminal connected to the second partial input voltage $v_b$, a (−) input terminal connected to the respective tap $T_n$ ... $T_1$ of the reference ladder and also two differential output terminals. In the figure the connections of the (−) input terminals of the differential amplifiers $D_1$ ... $D_n$ to the reference ladder are not fully drawn but indicated by arrows directing to the respective tap ($T_n$ ... $T_1$) to which the input terminal is connected. The output terminals of the two differential amplifiers of one amplifier pair are so interconnected that the amplifier output signals are subtracted from each other. Because the (−) input terminals of the amplifiers $C_1$ ... $C_n$ are connected to the taps $T_1$ ... $T_n$ and the (−) input terminals of the amplifiers $D_1$ ... $D_n$ to the taps $T_n$ ... $T_1$, it will be clear that each of the taps of the reference ladder L controls two amplifiers: tap $T_n$ controls amplifiers $C_n$ and $D_1$, tap $T_{n-1}$ controls amplifiers $C_{n-1}$ and $D_2$ and so on.

It may be noted that in each amplifier pair, in stead of the connections shown, e.g. the (+) input terminal of an amplifier may be connected to the tap T of the reference ladder and the (−) input terminal to the partial input voltage. Then the output terminals of one of the amplifiers of the pair have to be interchanged, so that the output signals of the two amplifiers now add instead of subtract.

The amplifiers C and D may be voltage amplifiers but preferably it are transconductance amplifiers transferring the input voltage to an output current. When the transconductance of each amplifier is denoted by G and when $E_1$ ... $E_n$ denote the reference voltage at each of the taps $T_1$ ... $T_n$ respectively, then the output current of the transconductance amplifier $C_1$ is $G(v_a-E_1)$ and the output current of the transconductance amplifier $D_1$ is $G(v_b-E_n)$, so that the output current $i_1$ of the amplifier pair $C_1$, $D_1$ is: $i_1=G(v_a-E_1)-G(v_b-E_n)=G\{v-(E_1-E_n)\}$. Similarly $i_2=G\{v-(E_2-E_{n-1})\}$, $i_3=G\{v-(E_3-E_{n-2})\}$ and so on until $i_n=G\{v-(E_n-E_1)\}$. From this it may be observed, that the taps $T_1$ and $T_n$ together form a pair of taps controlling the amplifier pairs $C_1$, $D_1$ and $C_n$, $D_n$. Equally the taps $T_2$ and $T_{n-1}$ form a pair of taps controlling the amplifier pairs $C_2$, $D_2$ and $C_{n-1}$, $D_{n-1}$ and so on.

In the arrangement of FIG. 1 the tap $T_n$ of the reference ladder is coupled to the ac-signal voltage $v_a$ through the input capacitance of the amplifier $C_a$. This may result in an ac-distortion of the reference voltage $E_n$. However, simultaneously the ac-signal voltage $v_b$ couples, through the input capacitance of the amplifier $D_1$, a substantially equal but polarity reversed ac-distortion to the same tap $T_n$, so that the net-result on the reference voltage $E_n$ is substantially zero.

One application of the arrangement of FIG. 1 is the generation of a digital representation of the differential input signal in a flash converter. In this kind of converters, the interest in the output signals $i_1$ ... $i_n$ is mainly found in the zero crossings thereof. From the above explanation, it is apparent that the zero crossing of $i_1$ is found at $v=E_1-E_n$, the zero crossing of $i_2$ is found at $v=E_2-E_{n-1}$ and so on until $v=E_n-E_1$ where the zero crossing of $i_n$ takes place. This conversion can be done by means of simple polarity detectors followed by digital encoding and is well known in the art. It may be observed that in the arrangement in accordance with the present invention each time one pair of taps of the reference ladder (e.g. $T_1$ and Tn.) is used to sense two in polarity opposite values of the differential input signal v, namely the values at $E_1-E_n$ and $E_n-E_1$.

It has to be noted that the differential amplifiers $C_1$ ... $C_n$ and $D_1$ ... $D_n$ need not be and usually will not be linear over the entire range of the input voltage $v_a$ and $v_b$ respectively. In fact they are linear only in a relatively small range around the applied reference voltage. Because the two amplifiers of one pair (e.g. $C_1$ and $D_1$) have to operate simultaneously to generate the output current ($i_1$), they should simultaneously operate in their linear range. With other words: when $v_a$ is equal to $E_1$, $v_b$ should be equal to $E_n$. With $v_a=v/2+v_{cm}$ and $v_b=-v/2+v_{cm}$ it follows that when $v/2+v_{cm}$ is equal to $E_1$ then $-v/2+v_{cm}$ should be equal to $E_n$ and this condition is fulfilled when $v_{cm}=(E_1+E_n)/2$. In a similar way it follows for the other amplifier pairs that $v_{cm}=(E_2+E_{n-1})/2$, $v_{cm}=(E_3+E_{n-2})/2$ etc. Consequently, the voltage course of the reference ladder, which should not necessarily be linear, should be antisymmetric with its mid-tap voltage equal to the common mode voltage of the input signal v. This task is performed by the arrangement of FIG. 2.

Figure 2:
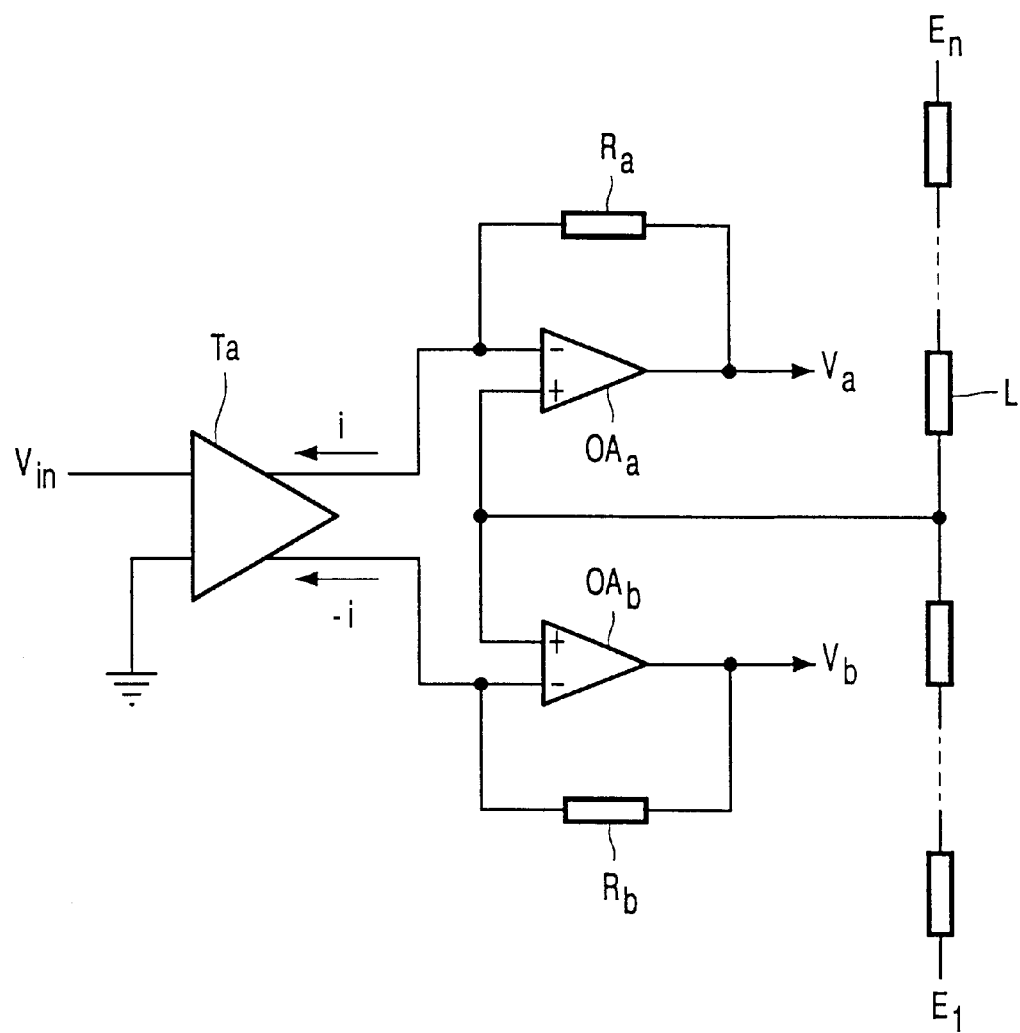

The arrangement of FIG. 2 comprises a transconductance amplifier TA which converts an input signal voltage $v_{in}$ (which may be single ended or differential) into two polarity reversed output currents i and −i. These currents are zero when the input signal voltage $v_{in}$ is zero. These two currents are applied to a (−) input of an operational amplifier $OA_a$ and of an operational amplifier $OA_b$ respectively. The operational amplifiers are fed back from their output terminal to their (−) input terminal through a feedback resistor $R_a$ and $R_b$ with resistance value R respectively. By this arrangement the amplifier $OA_a$ and its feedback resistor $R_a$ converts its input current i to a voltage iR between its output terminal and its (+) input terminal and equally the amplifier $Oa_b$ with its feedback resistor $R_b$ converts its input current −i to a voltage −iR between its output terminal and its (+) input terminal. The two (+) input terminals of the operational amplifiers $OA_a$ and $OA_b$ are connected to the midtap of the reference ladder L by which arrangement the midtap voltage $(E_1+E_n)/2$ is added to the two output voltages. Therewith the output voltage of the operational amplifier $OA_a$ is $v_a=iR+(E_1+E_n)/2$ and the output voltage of the operational amplifier $OA_b$ is $v_b=-iR+(E_1+E_n)/2$. These output voltages are used as the partial input voltages of the arrangement of FIG. 1, whereby it is ascertained that the common mode voltage of the input signal voltage equals the midtap voltage of the reference ladder L.

Other arrangements to equalize the common mode voltage of the input signal v and the midtap voltage of the reference ladder may be applied. E.g. by using the common mode voltage of the input signal voltage for the generation of the reference ladder voltages or by comparing the two voltages with each other and controlling one of them to minimize the difference.

Another application of the arrangement of FIG. 1 is the generation of a folding signal, which may be used to derive in an a//d converter the less significant bits of the digital output code. This folding signal may be obtained by alternatively adding and subtracting the respective output currents $i_1 \ldots i_n$ of the amplifier pairs of FIG. 1. Therefore, in case N=9, a folding signal $i_f = i_1 - i_2 + i_3 - i_4 + i_5 - i_6 + i_7 - i_8 + i_9$ is obtained. When the differential input signal v is low (high negative) the amplifier pair $C_1-D_1$ is in its linear range while all other amplifier pairs are saturated. With increasing v the current $i_1$, and therefore the folding current $i_f$, increases linearly. When the signal v further increases, the amplifier pair $C_1-D_1$ becomes saturated and the amplifier pair $C_2-D_2$ comes in its linear range. The output current $i_2$ now increases with the result that the folding current $i_f$ decreases. When the amplifier pair $C_3-D_3$ becomes operative the folding current $i_f$ again increases and so on. It should be apparent that the voltage steps of the reference ladder should correspond with the length of the linear range of the differential amplifiers, so that the linear range of an amplifier is finished when the linear range of the next amplifier begins.

An integrated circuit chip, comprising an aid converter according to the present invention, may require a supply voltage as low as 2,2 Volts. In this arrangement, each of the partial input voltages $v_a$ and $v_b$ may have a span of 1 Volt, so that the input signal v has a total voltage span of 2 Volts.

What is claimed is:

1. An analog to digital converter comprising a resistive reference ladder with a plurality of pairs of taps ($T_1-T_n$, $T_2-T_{n-1}$, ... ) for generating a plurality of pairs of reference voltages ($E_1-E_n$, $E_2-E_{n-1}$, ... ) and means for sensing a differential input signal (v) at each of said plurality of pairs of reference voltages, characterized in that each of said plurality of pairs of taps ($T_1-T_n$, $T_2-T_{n-1}$, ... ) of the reference ladder, which is used to sense a certain level of the differential input signal, is also used to sense the differential input signal at the level which is reversed in polarity with respect to said certain level.

2. An analog to digital converter as claimed in claim 1 characterized in that each of said means for sensing the differential input signal comprises a pair of transconductance amplifiers (C-D), which receives the differential input signal (v) and a pair of reference voltages ($E_1-E_n$), and means to combine the output currents of the transconductance amplifiers to a current which is zero when the differential input signal equals the difference between the voltages of said pair of reference voltages.

3. An analog to digital converter as claimed in claim 1 characterised by means to equalize the common mode voltage of the differential input signal (v) and the midtap voltage of the reference ladder (L) with each other.

4. An analog to digital converter as claimed in claim 3 characterized by a transconductance amplifier for converting an input signal voltage into two polarity reversed signal currents, and means to convert each of the two polarity reversed signal currents to polarity reversed signal voltages and to add the midtap voltage of the reference ladder thereto.

* * * * *